(12) United States Patent
Kim et al.

(10) Patent No.: US 12,230,310 B2
(45) Date of Patent: Feb. 18, 2025

(54) MEMORY AND OPERATION METHOD THEREOF

(71) Applicant: SK hynix Inc., Gyeonggi-do (KR)

(72) Inventors: Woongrae Kim, Gyeonggi-do (KR); Chul Moon Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 237 days.

(21) Appl. No.: 17/980,943

(22) Filed: Nov. 4, 2022

(65) Prior Publication Data
US 2023/0298653 A1 Sep. 21, 2023

(30) Foreign Application Priority Data

Mar. 17, 2022 (KR) .................. 10-2022-0033481

(51) Int. Cl.
| | |
|---|---|
| *G11C 11/406* | (2006.01) |
| *G11C 11/401* | (2006.01) |
| *G11C 11/4074* | (2006.01) |
| *G06F 3/06* | (2006.01) |
| *G11C 11/4078* | (2006.01) |

(52) U.S. Cl.
CPC ...... *G11C 11/40615* (2013.01); *G11C 11/401* (2013.01); *G11C 11/406* (2013.01); *G11C 11/40618* (2013.01); *G11C 11/4074* (2013.01); *G06F 3/0625* (2013.01); *G11C 11/4078* (2013.01); *G11C 2211/4067* (2013.01); *G11C 2211/4068* (2013.01)

(58) Field of Classification Search
CPC ........ G11C 11/40615; G11C 11/40618; G11C 11/4074; G11C 11/4078; G11C 5/146; G11C 11/40611; G11C 11/401; G11C 11/406; G11C 2211/4067; G11C 2211/4068; G06F 3/0625
See application file for complete search history.

(56) References Cited

U.S. PATENT DOCUMENTS

| | | | | |
|---|---|---|---|---|
| 5,886,932 | A * | 3/1999 | Choi | G11C 11/4074 365/222 |
| 8,837,233 | B2 * | 9/2014 | Sato | G11C 5/146 365/189.09 |
| 2005/0141310 | A1 * | 6/2005 | Lee | G11C 11/406 365/222 |
| 2006/0120193 | A1 * | 6/2006 | Casper | G11C 11/40615 365/222 |
| 2007/0002655 | A1 * | 1/2007 | Jeong | G11C 11/406 365/222 |
| 2007/0058474 | A1 * | 3/2007 | Sohn | G11C 5/14 365/226 |

(Continued)

FOREIGN PATENT DOCUMENTS

| | | |
|---|---|---|
| KR | 10-2007-0051062 A | 5/2007 |
| KR | 10-2014-0116650 A | 10/2014 |

*Primary Examiner* — Hoai V Ho
*Assistant Examiner* — Justin Bryce Heisterkamp
(74) *Attorney, Agent, or Firm* — IP & T GROUP LLP

(57) ABSTRACT

An operation method of a memory may include entering a self-refresh mode, increasing a level of a back-bias voltage in response to entering the self-refresh mode, performing self-refresh operations in a first cycle, confirming that the back-bias voltage reaches a level of a first threshold voltage, and performing the self-refresh operations in a second cycle longer than the first cycle in response to the confirmation.

16 Claims, 5 Drawing Sheets

(56) References Cited

U.S. PATENT DOCUMENTS

| | | | |
|---|---|---|---|
| 2007/0153611 A1* | 7/2007 | Lee | G11C 5/146 |
| | | | 365/226 |
| 2008/0158945 A1* | 7/2008 | Im | G11C 29/028 |
| | | | 365/182 |
| 2008/0192557 A1 | 8/2008 | Casper | |
| 2010/0034031 A1* | 2/2010 | Kang | G11C 11/4074 |
| | | | 365/207 |
| 2013/0176803 A1* | 7/2013 | Lee | G11C 11/40626 |
| | | | 365/207 |
| 2014/0321226 A1* | 10/2014 | Pyeon | H02M 3/073 |
| | | | 365/189.011 |
| 2017/0278561 A1* | 9/2017 | Oh | G11C 11/4094 |
| 2019/0198091 A1* | 6/2019 | Lin | G11C 11/40615 |

\* cited by examiner

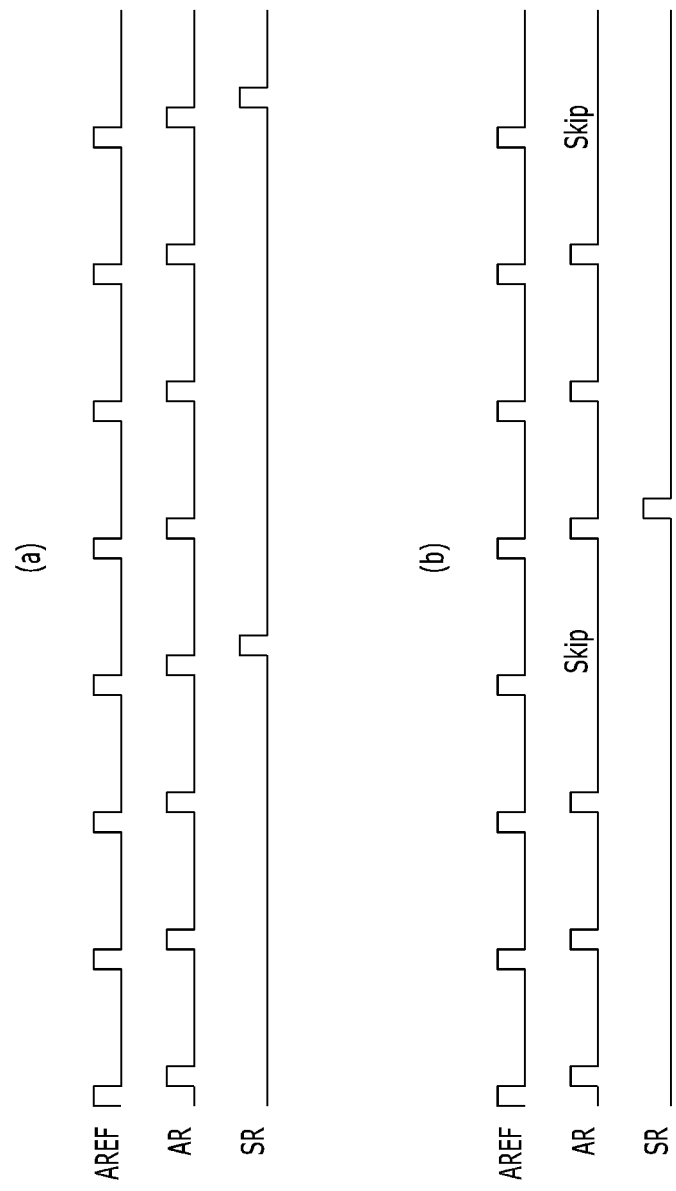

MEMORY AND OPERATION METHOD THEREOF

CROSS-REFERENCE TO RELATED APPLICATION

This application claims priority under 35 U.S.C. § 119 to Korean Patent Application No. 10-2022-0033481 filed on Mar. 17, 2022, which is incorporated herein by reference in its entirety.

BACKGROUND

1. Field

Embodiments of the present patent literature relate to a memory.

2. Discussion of the Related Art

A memory cell of a memory includes a cell transistor serving as a switch and a cell capacitor that stores electric charges (data). A logic level 'high' (logic 1) or a logic level 'low' (logic 0) of data is determined according to whether there are electric charges in the cell capacitor in the memory cell, that is, whether a terminal voltage of the cell capacitor is high or low.

Since the storage of data indicates accumulation of electric charges in the cell capacitor, there is no power consumption in principle. However, since the initial amount of electric charges stored in the cell capacitor is removed due to a leakage current caused by a PN junction and the like of a MOS transistor (cell transistor), data may be lost. In order to substantially prevent this, it is necessary to read the data in the memory cell before the data is lost and store a normal charge amount again according to the read information. Only when such an operation is periodically repeated, the content of stored data is retained. Such an operation of storing cell charge again is called a refresh operation.

The refresh operation is classified into an auto-refresh operation performed whenever a refresh command is applied from a memory controller to the memory, and a self-refresh operation performed by the memory itself when the memory controller sets only a refresh period.

On the other hand, as the degree of integration of a memory increases, the spacing between a plurality of word lines included in the memory is decreasing. As the spacing between the word lines decreases, a coupling effect between adjacent word lines is increasing.

On the other hand, whenever data is inputted/outputted to/from a memory cell, a word line toggles between an activated (active) state and a deactivated state. As the coupling effect between adjacent word lines increases as described above, there occurs a phenomenon in which data in a memory cell connected to a word line adjacent to a frequently activated word line is damaged. Such a phenomenon is called row hammering, and the data in the memory cell is damaged due to word line disturbance before the memory cell is refreshed, which may be problematic.

FIG. 1 is a diagram for describing row hammering and is a diagram illustrating a part of a cell array included in a memory device.

In FIG. 1, 'WLL' corresponds to a word line having a large number of activations, and 'WLL−1' and 'WLL+1' correspond to word lines disposed adjacent to 'WLL', that is, word lines each having the number of activations closer to that of the word line. 'CL' denotes a memory cell connected to 'WLL', 'CL−1' denotes a memory cell connected to 'WLL−1', and 'CL+1' denotes a memory cell connected to 'WLL+1'. The memory cell 'CL' includes a cell transistor TL and a cell capacitor CAPL, the memory cell 'CL−1' includes a cell transistor TL−1 and a cell capacitor CAPL−1, and the memory cell 'CL+1' includes a cell transistor TL+1 and a cell capacitor CAPL+1.

In FIG. 1, when 'WLL' is activated or deactivated, voltages of 'WLL−1' and 'WLL+1' rise or fall due to a coupling phenomenon occurring between 'WLL' and 'WLL−1'/'WLL+1', and the amount of charge in the cell capacitors CAPL−1 and CAPL+1 is also affected. Therefore, when 'WLL' is frequently activated and toggles between an activated state and a deactivated state, a change in the amount of charge stored in the cell capacitors CAPL−1 and CAPL+1 included in 'CL−1' and 'CL+1' may increase and data in the memory cell may deteriorate.

Furthermore, electromagnetic waves generated while the word line toggles between an activated state and a deactivated state may damage data by introducing electrons into a cell capacitor of a memory cell connected to an adjacent word line or discharging electrons from the cell capacitor.

The row hammering mainly occurs when a specific row is repeatedly activated. As a method for solving the row hammering, a method of refreshing adjacent rows of a row activated excessively multiple times is used.

SUMMARY

Various embodiments of the present disclosure are directed to providing a technique for increasing resistance to row hammering while reducing current consumption due to a refresh operation of a memory.

An operation method of a memory in accordance with an embodiment of the present disclosure may include: entering a self-refresh mode; increasing a level of a back-bias voltage in response to entering the self-refresh mode; performing self-refresh operations in a first cycle; confirming that the back-bias voltage reaches a level of a first threshold voltage; and performing the self-refresh operations in a second cycle longer than the first cycle in response to the confirmation.

An operation method of a memory in accordance with another embodiment of the present disclosure may include: entering a self-refresh mode; performing self-refresh operations; terminating the self-refresh mode; decreasing a level of a back-bias voltage in response to the termination of the self-refresh mode; performing auto-refresh operations at a refresh rate having a first value; confirming that a level of the back-bias voltage reaches a level of a threshold voltage; and performing the auto-refresh operations at the refresh rate having a second value lower than the first value in response to the confirmation.

A memory in accordance with still another embodiment of the present disclosure may include: a back-bias voltage generator configured to generate a back-bias voltage aiming at a first target voltage in a self-refresh mode, and generate the back-bias voltage aiming at a second target voltage lower than the first target voltage in a normal mode; and a self-refresh circuit configured to control self-refresh operations in the self-refresh mode, control the self-refresh operations in a first cycle until a level of the back-bias voltage reaches a first threshold voltage which is higher than the second target voltage and equal to or less than the first target voltage, after entering the self-refresh mode, and control the self-refresh operations in a second cycle longer than the first cycle after the level of the back-bias voltage reaches the first threshold voltage.

A memory in accordance with yet another embodiment of the present disclosure may include: a back-bias voltage generator configured to generate a back-bias voltage aiming at a first target voltage in a self-refresh mode, and generate the back-bias voltage aiming at a second target voltage lower than the first target voltage in a normal mode; and an auto-refresh circuit configured to control auto-refresh operations in response to an auto-refresh command in the normal mode after the self-refresh mode is shifted to the normal mode, control the auto-refresh operations at a refresh rate having a first value until a level of the back-bias voltage reaches a threshold voltage which is lower than the first target voltage and equal to or greater than the second target voltage, and control the auto-refresh operations at the refresh rate having a second value lower than the first value after the level of the back-bias voltage reaches the threshold voltage.

An operation method of a memory in accordance with still yet another embodiment of the present disclosure may include: performing, in a self-refresh mode, self-refresh operations in a shorter cycle while increasing a back-bias voltage level and in a longer cycle after the back-bias voltage level reaches a first threshold; and performing, after the self-refresh mode, auto-refresh operations at a smaller rate while decreasing the back-bias voltage level and at a greater rate after the back-bias voltage level reaches a second threshold.

According to embodiments of the present disclosure, resistance to row hammering may be increased while reducing current consumption due to a refresh operation of a memory.

BRIEF DESCRIPTION OF THE DRAWINGS

FIG. 5 is a diagram illustrating an operation according to a refresh rate of an auto-refresh circuit in accordance with an embodiment of the present disclosure.

DETAILED DESCRIPTION

Figure 1:
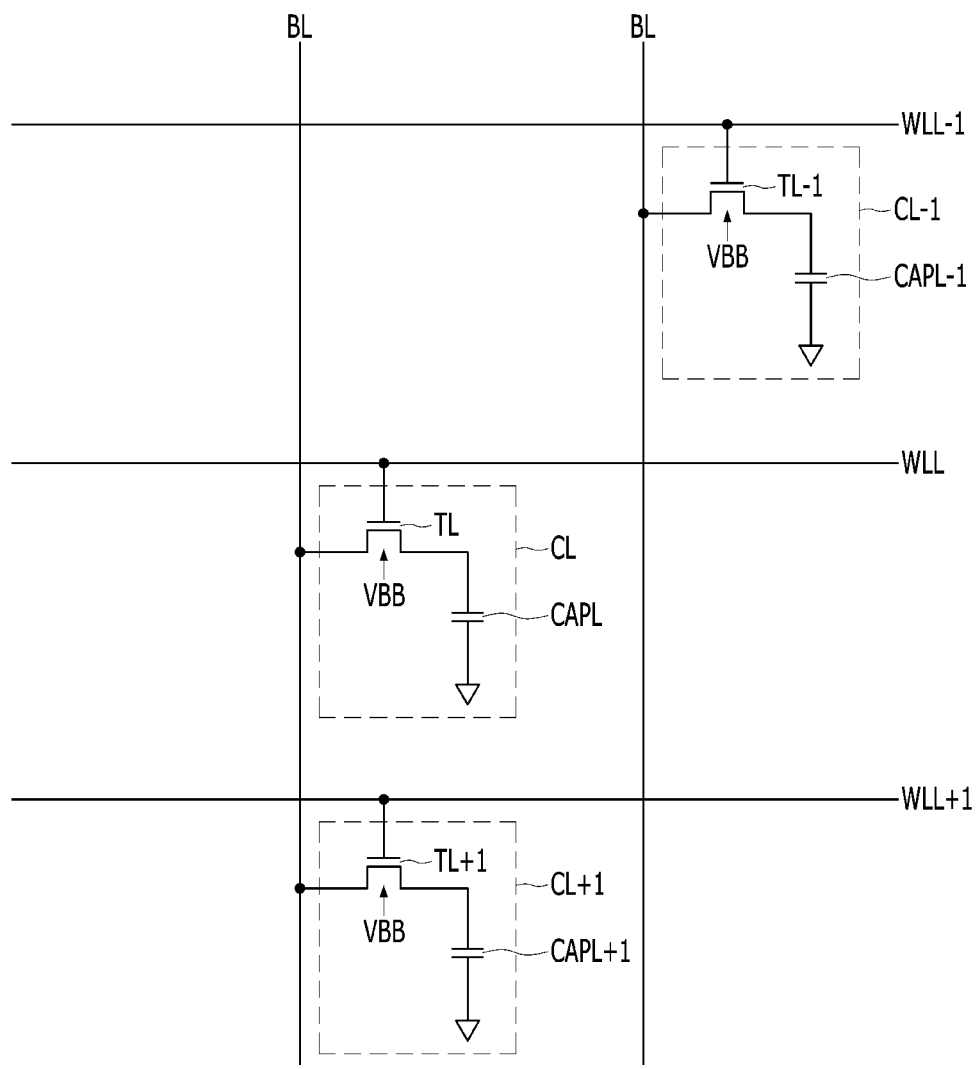
FIG. 1 is a diagram for describing row hammering.

Hereinafter, in order to describe in detail the present disclosure for a person skilled in the art to which the present disclosure pertains to be able to easily carry out the technical idea of the present disclosure, embodiments of the present disclosure will be described with reference to the accompanying drawings. In describing the present disclosure, publicly-known configurations irrelevant to the subject matter of the present disclosure may be omitted. In the reference numerals to components of each drawing, it should be noted that only the same components are given the same reference numerals if possible even though they are illustrated in different drawings.

Figure 2:
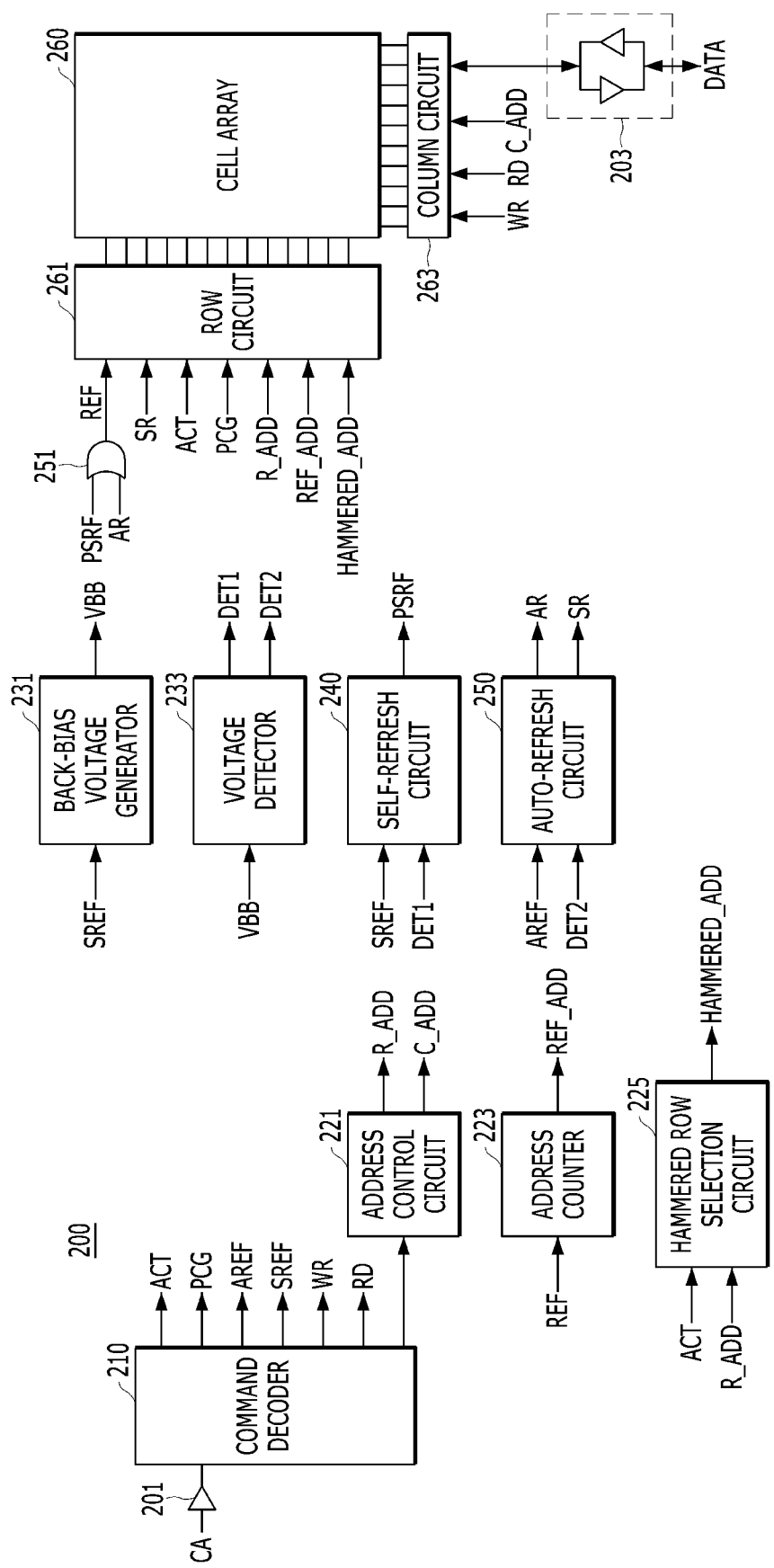
FIG. 2 is a configuration diagram of a memory in accordance with an embodiment of the present disclosure.

FIG. 2 is a configuration diagram of a memory 200 in accordance with an embodiment of the present disclosure.

Referring to FIG. 2, the memory 200 may include a command address reception circuit 201, a data transmission/reception circuit 203, a command decoder 210, an address control circuit 221, an address counter 223, a hammered row selection circuit 225, a back-bias voltage generator 231, a voltage detector 233, a self-refresh circuit 240, an auto-refresh circuit 250, a cell array 260, a row circuit 261, and a column circuit 263.

The command address reception circuit 201 may receive a command and an address CA. Depending on the type of the memory 200, a command and an address may also be inputted to substantially the same input terminals and may also be inputted to separate input terminals. The present embodiment shows an example in which a command and an address are inputted to substantially the same input terminals. The command and the address CA may be multi-bits.

The data transmission/reception circuit 203 may receive data DATA or transmit the data DATA. The data transmission/reception circuit 203 may receive the data DATA to be written to the cell array 260 from a memory controller during a write operation, and transmit the data DATA read from the cell array 260 to the memory controller during a read operation.

The command decoder 210 may decode the command and the address CA, find out the type of operation instructed by the memory controller to the memory 200, and generate internal command signals ACT, PCG, AREF, SREF, WR, and RD. An active signal ACT may be a signal that is activated when an active operation is instructed, and a precharge signal PCG may be a signal that is activated when a precharge operation is instructed. An auto-refresh signal AREF may be a signal that is activated when an auto-refresh operation is instructed, and a self-refresh mode signal SREF may be a signal that is activated while a self-refresh mode is set. A read signal RD may be a signal that is activated when a read operation is instructed, and a write signal WR may be a signal that is activated when a write operation is instructed.

The address control circuit 221 may classify addresses received from the command decoder 210 into a row address R_ADD and a column address C_ADD. The address control circuit 221 may classify an address, which is received when an active operation is instructed as a result of decoding by the command decoder 210, into the row address R_ADD, and classify an address, which is received when read and write operations are instructed, into the column address C_ADD.

The address counter 223 may generate a refresh address REF_ADD to be used for a refresh operation. The address counter 223 may change the refresh address REF_ADD by +1 whenever the refresh signal REF is activated. Since the refresh address REF_ADD is changed whenever the refresh signal REF is activated, rows of the cell array 260 may be sequentially refreshed.

The hammered row selection circuit 225 may select a row with a high probability of data loss due to row hammering. Specifically, the hammered row selection circuit 225 may select adjacent rows of a row, which have been activated excessively among the rows of the cell array 260, as a hammered row with a high probability of data loss, and provide an address corresponding to the hammered row to the row circuit 261 as a hammered address HAMMERED_ADD.

The back-bias voltage generator 231 may generate a back-bias voltage VBB that is a voltage applied to bulks (see FIG. 1) of cell transistors of memory cells of the cell array 260. The back-bias voltage VBB may generally have a level of a negative voltage lower than a ground voltage. In order to reduce current consumption of the memory 200 by increasing a refresh cycle, the level of the back-bias voltage VBB needs to be relatively high, and in order to increase resistance to row hammering, the level of the back-bias voltage VBB needs to be relatively low. For example, the optimal level of the back-bias voltage VBB for increasing the refresh cycle may be −0.4 V, and the optimal level of the back-bias voltage VBB for increasing the resistance to row hammering may be −0.8 V.

The back-bias voltage generator 231 may generate the back-bias voltage VBB aiming at a level of a first target voltage (for example, −0.4 V) during a self-refresh mode in which the self-refresh mode signal SREF is activated, and generate the back-bias voltage VBB aiming at a level of a second target voltage (for example, −0.8 V) lower than the first target voltage during a normal mode in which the self-refresh mode signal SREF is deactivated. During the self-refresh mode, only refresh operations are performed and no repeated active operation is performed on a specific row, and thus no row hammering occurs. Accordingly, during the self-refresh mode, the back-bias voltage generator 231 may generate the back-bias voltage VBB at a relatively high first target voltage level to increase the refresh cycle. In the normal mode, it is possible to repeatedly perform an active operation on a specific row, and thus the row hammering may occur. Accordingly, during the normal mode, the back-bias voltage generator 231 may generate the back-bias voltage VBB at a relatively low second target voltage level in order to increase resistance to the row hammering.

Since the back-bias voltage VBB is a voltage applied to numerous cell transistors in the cell array 260, the level of the back-bias voltage VBB is less likely to be abruptly changed. That is, it may take a significant amount of time for the back-bias voltage generator 231 to change the level of the back-bias voltage VBB from the first target voltage to the second target voltage or from the second target voltage to the first target voltage.

The voltage detector 233 may be provided to confirm whether the level of the back-bias voltage VBB has been sufficiently changed. The voltage detector 233 may activate a first detection signal DET1 when the level of the back-bias voltage VBB is higher than a first threshold voltage. Furthermore, the voltage detector 233 may activate a second detection signal DET2 when the level of the back-bias voltage VBB is lower than a second threshold voltage. The first threshold voltage may have a level higher than the second target voltage (for example, −0.8 V) and equal to or less than the first target voltage (for example, −0.4 V). For example, the first threshold voltage may be −0.45 V close to the level of the first target voltage. When the first detection signal DET1 is activated in a case where the level of the back-bias voltage VBB is changed from the second target voltage to the first target voltage, this may indicate that the level of the back-bias voltage VBB has been sufficiently changed close to the level of the first target voltage. The second threshold voltage may have a level lower than the first target voltage (for example, −0.4 V) and equal to or greater than the second target voltage (for example, −0.8 V). For example, the second threshold voltage may be −0.75 V close to the level of the second target voltage. When the second detection signal DET2 is activated in a case where the level of the back-bias voltage VBB is changed from the first target voltage to the second target voltage, this may indicate that the level of the back-bias voltage VBB has been sufficiently changed close to the level of the second target voltage.

The self-refresh circuit 240 may control self-refresh operations in the self-refresh mode in which the self-refresh mode signal SREF is activated. The self-refresh circuit 240 may periodically activate a self-refresh pulse PSRF in the self-refresh mode. The self-refresh operation may be performed whenever the self-refresh pulse PSRF is activated.

After entering the self-refresh mode, until the level of the back-bias voltage VBB is sufficiently changed from the second target voltage to the first target voltage, that is, until the level of the back-bias voltage VBB reaches the first threshold voltage and the first detection signal DET1 is activated, the self-refresh circuit 240 may control the self-refresh operations in a relatively short first cycle. That is, after entering the self-refresh mode, the self-refresh circuit 240 may frequently activate the self-refresh pulse PSRF every short cycle until the first detection signal DET1 is activated. Before the level of the back-bias voltage VBB is sufficiently increased, refresh characteristics may be poor, that is, the electric charges stored in the cell capacitor of the memory cell may be easily leaked. Therefore, the refresh operation is performed more frequently.

After the first detection signal DET1 is activated, the self-refresh circuit 240 may control the self-refresh operations in a second cycle longer than the first cycle. That is, after the first detection signal DET1 is activated, the self-refresh circuit 240 may less frequently activate the self-refresh pulse PSRF every long cycle. Since the refresh characteristics of the memory cell are improved after the level of the back-bias voltage VBB is sufficiently increased, there is no problem even though the refresh operation is performed less frequently, which makes it possible to reduce current consumption in the memory 200.

The auto-refresh circuit 250 may control auto-refresh operations in response to an auto-refresh signal AREF that is activated whenever an auto-refresh command is applied. The auto-refresh circuit 250 may activate an auto-refresh pulse AR and a smart refresh pulse SR in response to the auto-refresh signal AREF. When the auto-refresh pulse AR is activated, a row corresponding to the refresh address REF_ADD may be refreshed in the cell array 260, and when the smart refresh pulse SR is activated, a row corresponding to the hammered address HAMMERED_ADD may be refreshed in the cell array 260. The auto-refresh circuit 250 may activate the smart refresh pulse SR once whenever the auto-refresh pulse AR is activated a plurality of times (for example, 4 times).

After the self-refresh mode is terminated, until the level of the back-bias voltage VBB is sufficiently changed from the first target voltage to the second target voltage, that is, until the level of the back-bias voltage VBB reaches the second threshold voltage and the second detection signal DET2 is activated, the auto-refresh circuit 250 may control the auto-refresh operations at a relatively high refresh rate having a first value. Whenever the auto-refresh command is applied, that is, whenever the auto-refresh signal AREF is activated, the auto-refresh circuit 250 may activate the refresh pulses AR and SR one or more times, or may sometimes skip the activation of the refresh pulses AR and SR. Whenever the auto-refresh pulse AR is activated once, the smart refresh pulse SR is activated once, or the refresh pulses AR and SR are activated once, one row is refreshed in the cell array 260. The refresh rate may be 'a number of rows to be refreshed'/'a number of auto-refresh commands to be applied'. For example, in a case where the auto-refresh command is applied 16 times, when the auto-refresh pulse AR is activated 16 times and the smart refresh pulse SR is activated 4 times, the refresh rate may be 20/16. Before the level of the back-bias voltage VBB is sufficiently decreased, the vulnerability to the row hammering attack may increase. Therefore, defensive power to the row hammering attack is increased by increasing the refresh rate.

After the second detection signal DET2 is activated, the auto-refresh circuit 250 may control the auto-refresh operations at the refresh rate having a second value lower than the first value. When the level of the back-bias voltage VBB is sufficiently decreased, the resistance to the row hammering attack increases. Therefore, since there is no need to perform an auto-refresh operation at a high refresh rate, the refresh rate may be lowered and current consumption can be reduced.

An OR gate 251 may receive the auto-refresh pulse AR and the self-refresh pulse PSRF and output the refresh signal REF. When one of the auto-refresh pulse AR and the self-refresh pulse PSRF is activated, the refresh signal REF may be activated.

The cell array 260 may include a plurality of memory cells arranged in a plurality of rows and a plurality of columns. Each of the memory cells includes a cell capacitor and a cell transistor, and the back-bias voltage VBB may be applied to the bulk of the cell transistor. In the cell array 260, row lines arranged in a row direction are referred to as word lines, and column lines arranged in a column direction are referred to as bit lines. Each of the memory cells may be connected to one of the row lines and one of the column lines.

The row circuit 261 may activate a row selected by the row address R_ADD among the rows of the cell array 260 when the active signal ACT is activated. That is, the row circuit 261 may activate a word line selected by the row address R_ADD among the word lines of the cell array 260. When the precharge signal PCG is activated, the row circuit 261 may precharge the activated row. The row circuit 261 may refresh a row selected by the refresh address REF_ADD among the rows of the cell array 260 when the refresh signal REF is activated. That is, memory cells in a row selected by the refresh address may be refreshed. The row circuit 261 may also refresh a row selected by the hammered address HAMMERED_ADD among the rows of the cell array 260 when the smart refresh pulse SR is activated.

The column circuit 263 may write data to memory cells of columns selected by the column address C_ADD among the columns of the cell array 260 when the write signal WR is activated. The column circuit 263 may read the data from the memory cells of the columns selected by the column address C_ADD among the columns of the cell array when the read signal RD is activated. The column circuit 263 may include a bit line sense amplifier array, a column decoder, write drivers, and local sense amplifiers.

Figure 3:
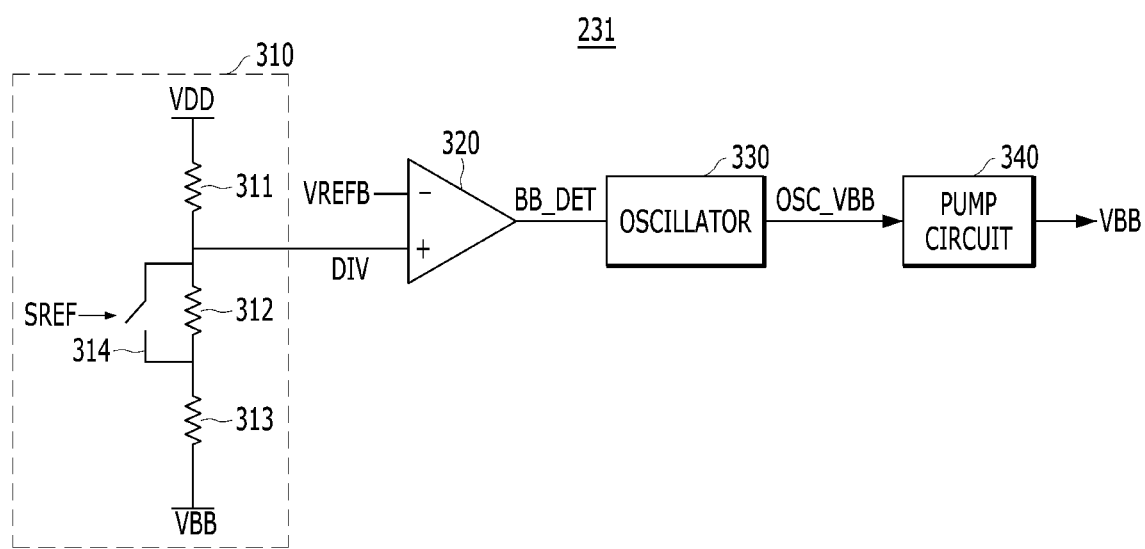
FIG. 3 is a configuration diagram of a back-bias voltage generator in FIG. 2 in accordance with an embodiment of the present disclosure.

FIG. 3 is a configuration diagram of the back-bias voltage generator 231 in FIG. 2 in accordance with an embodiment of the present disclosure.

Referring to FIG. 3, the back-bias voltage generator 231 may include a voltage divider 310, a comparator 320, an oscillator 330, and a pump circuit 340.

The voltage divider 310 may voltage-divide a power supply voltage VDD and the back-bias voltage VBB and generate a divided voltage DIV. The voltage divider 310 may include resistors 311 to 313 and a switch 314. The switch 314 may be turned on when the self-refresh mode signal SREF is activated. When the switch 314 is turned on, the level of the divided voltage DIV may decrease because the resistor 312 is bypassed, and when the switch 314 is turned off, the level of the divided voltage DIV may increase because the resistor 312 is not bypassed.

The comparator 320 may compare the voltage levels of a reference voltage VREFB and the divided voltage DIV. The comparator 320 may activate an output signal BB_DET when the level of the divided voltage DIV is higher than the level of the reference voltage VREFB.

The oscillator 330 may toggle a periodic wave OSC_VBB during a period in which the output signal BB_DET is activated. The oscillator 330 may fix the periodic wave OSC_VBB to one voltage level without toggling the periodic wave OSC_VBB during a period in which the output signal BB_DET is deactivated.

The pump circuit 340 may decrease the level of the back-bias voltage VBB by performing a charge pumping operation when the periodic wave OSC_VBB toggles. The pump circuit 340 may not perform the charge pumping operation during a period in which the periodic wave OSC_VBB does not toggle.

The back-bias voltage generator 231 may operate in a manner of decreasing the level of the back-bias voltage VBB when the level of the divided voltage DIV is higher than the reference voltage VREFB. When the self-refresh mode signal SREF is activated, the level of the divided voltage DIV is decreased. Accordingly, the level of the back-bias voltage VBB may be relatively increased during a period in which the self-refresh mode signal SREF is activated, and may be relatively decreased during a period in which the self-refresh mode signal SREF is deactivated.

Figure 4:
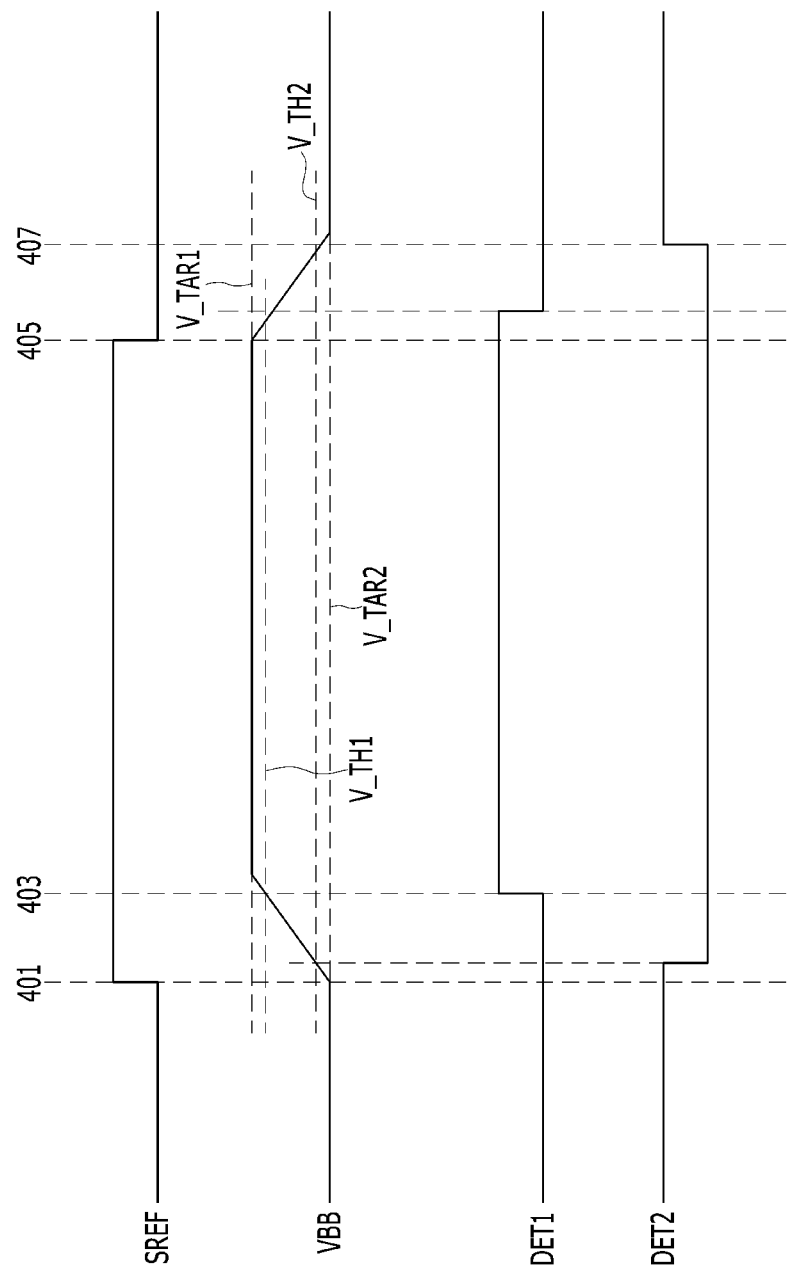
FIG. 4 is a timing diagram illustrating an operation of the memory in FIG. 2 in accordance with an embodiment of the present disclosure.

FIG. 4 is a timing diagram illustrating an operation of the memory 200 in FIG. 2 in accordance with an embodiment of the present disclosure.

Referring to FIG. 4, the self-refresh mode may be started at a time point 401 when the self-refresh mode signal SREF is activated. The back-bias voltage generator 231 may increase the level of the back-bias voltage VBB having the level of a second target voltage V_TAR2, from the time point 401 when the self-refresh mode is started.

The self-refresh circuit 240 may control self-refresh operations by periodically activating a self-refresh pulse. In a period before a time point 403 when the back-bias voltage VBB reaches a first threshold voltage V_TH1, the self-refresh circuit 240 may control the self-refresh operation in a short cycle.

At the time point 403 when the back-bias voltage VBB reaches the first threshold voltage V_TH1, the first detection signal DET1 may be activated to a logic high level. In response to the activated first detection signal DET1, the self-refresh circuit 240 may change the cycle of the self-refresh operation to be longer.

The self-refresh mode may be terminated at a time point 405 when the self-refresh mode signal SREF is deactivated. The back-bias voltage generator 231 may decrease the level of the back-bias voltage VBB having the level of a first target voltage V_TAR1, from the time point 405 when the self-refresh mode is terminated.

From the time point 405 when the self-refresh mode is terminated, the auto-refresh circuit 250 may control auto-refresh operations in response to the auto-refresh command. In a period before a time point 407 when the back-bias voltage VBB reaches a second threshold voltage V_TH2, the auto-refresh circuit 250 may perform the auto-refresh operations at a high refresh rate. FIG. 5 illustrates that the auto-refresh circuit 250 operates at a high refresh rate. Referring to (a) in FIG. 5, the auto-refresh circuit 250 activates the auto-refresh pulse AR eight times and activates the smart refresh pulse SR twice while the auto-refresh signal AREF is activated eight times. That is, the refresh rate is 10/8.

At a time point 407 when the back-bias voltage VBB reaches the second threshold voltage V_TH2, the second detection signal DET2 may be activated to a logic high level.

In response to the activated second detection signal DET2, the auto-refresh circuit 250 may change the refresh rate to be low. Referring to (b) in FIG. 5 it is illustrated that the auto-refresh circuit 250 operates at a low refresh rate. It can be seen that the auto-refresh circuit 250 activates the auto-refresh pulse AR six times and activates the smart refresh pulse SR once while the auto-refresh signal AREF is activated eight times. That is, the refresh rate is 7/8.

Although the technical spirit of the present disclosure has been specifically described according to the above embodiments, it should be noted that the above embodiment is for description, not for its limitation. Furthermore, those who skilled in the art will understand that various embodiments can be made within the scope of the technical spirit of the present disclosure and the following claims. Furthermore, the embodiments may be combined to form additional embodiments.

What is claimed is:

1. An operation method of a memory, the operation method comprising:
    entering a self-refresh mode;
    increasing a level of a back-bias voltage in response to entering the self-refresh mode;
    performing self-refresh operations in a first cycle;
    confirming that the level of the back-bias voltage reaches a level of a first threshold voltage; and
    performing the self-refresh operations in a second cycle longer than the first cycle in response to confirming that the level of the back-bias voltage reaches the level of the first threshold voltage.

2. The operation method of claim 1, further comprising:
    terminating the self-refresh mode;
    decreasing the level of the back-bias voltage in response to the termination of the self-refresh mode;
    performing auto-refresh operations at a refresh rate having a first value;
    confirming that the level of the back-bias voltage reaches a level of a second threshold voltage lower than the first threshold voltage; and
    performing the auto-refresh operations at the refresh rate having a second value lower than the first value in response to confirming that the level of the back-bias voltage reaches the level of the second threshold voltage.

3. The operation method of claim 1, wherein the back-bias voltage is a voltage applied to bulks of cell transistors.

4. The operation method of claim 2, wherein the refresh rate is determined based on 'a number of rows to be refreshed'/'a number of auto-refresh commands to be applied'.

5. An operation method of a memory, the operation method comprising:
    entering a self-refresh mode;
    performing self-refresh operations;
    terminating the self-refresh mode;
    decreasing a level of a back-bias voltage in response to the termination of the self-refresh mode;
    performing auto-refresh operations at a refresh rate having a first value;
    confirming that the level of the back-bias voltage reaches a level of a threshold voltage; and
    performing the auto-refresh operations at the refresh rate having a second value lower than the first value in response to confirming that the level of the back-bias voltage reaches the level of the threshold voltage.

6. The operation method of claim 5,
    wherein the back-bias voltage is a voltage applied to bulks of cell transistors, and
    wherein the refresh rate is determined based on 'a number of rows to be refreshed'/'a number of auto-refresh commands to be applied'.

7. A memory comprising:
    a back-bias voltage generator configured to generate a back-bias voltage aiming at a first target voltage in a self-refresh mode, and generate the back-bias voltage aiming at a second target voltage lower than the first target voltage in a normal mode; and
    a self-refresh circuit configured to control self-refresh operations in the self-refresh mode, control the self-refresh operations in a first cycle until a level of the back-bias voltage reaches a first threshold voltage which is higher than the second target voltage and equal to or less than the first target voltage, after entering the self-refresh mode, and control the self-refresh operations in a second cycle longer than the first cycle after the level of the back-bias voltage reaches the first threshold voltage.

8. The memory of claim 7, further comprising an auto-refresh circuit configured to control auto-refresh operations in response to an auto-refresh command in the normal mode after the self-refresh mode is terminated, control the auto-refresh operations at a refresh rate having a first value until the level of the back-bias voltage reaches a second threshold voltage which is lower than the first target voltage and equal to or greater than the second target voltage, and control the auto-refresh operations at the refresh rate having a second value lower than the first value after the level of the back-bias voltage reaches the second threshold voltage.

9. The memory of claim 8, further comprising a voltage detector configured to detect whether the level of the back-bias voltage has reached the first threshold voltage and whether the level of the back-bias voltage has reached the second threshold voltage.

10. The memory of claim 8, further comprising a cell array including a plurality of memory cells arranged in a plurality of rows and a plurality of columns,
    wherein each of the plurality of memory cells includes a cell capacitor and a cell transistor.

11. The memory of claim 10, wherein the back-bias voltage is applied to bulks of the cell transistors of the memory cells.

12. The memory of claim 10, wherein the refresh rate is determined based on 'a number of rows to be refreshed'/'a number of auto-refresh commands to be applied'.

13. A memory comprising:
    a back-bias voltage generator configured to generate a back-bias voltage aiming at a first target voltage in a self-refresh mode, and generate the back-bias voltage aiming at a second target voltage lower than the first target voltage in a normal mode; and
    an auto-refresh circuit configured to control auto-refresh operations in response to an auto-refresh command in the normal mode after the self-refresh mode is shifted to the normal mode, control the auto-refresh operations at a refresh rate having a first value until a level of the back-bias voltage reaches a threshold voltage which is lower than the first target voltage and equal to or greater than the second target voltage, and control the auto-refresh operations at the refresh rate having a second value lower than the first value after the level of the back-bias voltage reaches the threshold voltage.

14. The memory of claim 13, further comprising a voltage detector configured to detect whether the level of the back-bias voltage has reached the threshold voltage.

15. The memory of claim 13, wherein the refresh rate is determined based on 'a number of rows to be refreshed'/'a number of auto-refresh commands to be applied'.

16. An operating method of a memory, the operating method comprising:
   performing, in a self-refresh mode, self-refresh operations in a first cycle while increasing a back-bias voltage level and in a second cycle longer than the first cycle after the back-bias voltage level reaches a first threshold; and
   performing, after the self-refresh mode, auto-refresh operations at a first rate while decreasing the back-bias voltage level and at a second rate less than the first rate after the back-bias voltage level reaches a second threshold.

* * * * *